United States Patent [19]
Christensen et al.

[11] Patent Number: 5,889,306
[45] Date of Patent: Mar. 30, 1999

[54] BULK SILICON VOLTAGE PLANE FOR SOI APPLICATIONS

[75] Inventors: Todd Alan Christensen, Rochester; John Sheets, Zumbrota, both of Minn.

[73] Assignee: International Business Machines Corporation, Armonk, N.Y.

[21] Appl. No.: 782,462

[22] Filed: Jan. 10, 1997

[51] Int. Cl.$^6$ .......................... H01L 27/01; H01L 27/12; H01L 31/0392

[52] U.S. Cl. .......................... 257/350; 257/351; 257/353; 257/354

[58] Field of Search .................................. 257/758, 774, 257/750, 347, 348, 350, 351, 353, 354

[56] References Cited

U.S. PATENT DOCUMENTS

| | | | |
|---|---|---|---|
| 4,478,655 | 10/1984 | Nagakubo et al. | 257/351 X |
| 5,145,802 | 9/1992 | Tyson et al. | 437/63 |
| 5,286,670 | 2/1994 | Kang et al. | 437/61 |
| 5,294,821 | 3/1994 | Iwamatsu | 257/351 |
| 5,479,048 | 12/1995 | Yallup et al. | 257/621 |
| 5,654,573 | 8/1997 | Oashi et al. | 257/349 |

*Primary Examiner*—William Mintel
*Attorney, Agent, or Firm*—John J. Gresens; Karuna Ojanen; Merchant, Gould, Smith, Edell, Welter & Schmidt

[57] ABSTRACT

A semiconductor device including a conductive substrate, an insulator layer, a silicon layer doped with impurities and forming a first transistor and a second transistor, an isolation volume between said first transistor and said second transistor, and a conductive stud extending from the doped silicon layer to the substrate.

23 Claims, 8 Drawing Sheets

BULK SILICON VOLTAGE PLANE FOR SOI APPLICATIONS

FIELD OF THE INVENTION

The invention relates generally to devices having reduced surface wiring for power source and ground applications. More specifically, the invention relates to silicon-on-insulator devices which use the bulk silicon substrate as a voltage plane for power source and ground applications.

BACKGROUND OF THE INVENTION

Semiconductor processing has moved towards the production of smaller and smaller devices having greater computing capability. The reduction in device size and increase in power has resulted in a higher density of transistors in a given unit area. Enhanced semiconductor fabrication techniques, such as silicon on insulator (SOI) processing, tend to increase metal wiring requirements due to significant resistance increases in device components such as the transistor source and drain.

Specific applications, such as arrays, are often impacted by the amount of wiring needed to fully enable the application. Wiring in semiconductor devices is generally configured in multiple planes, especially when multiple devices are configured in a dense pattern. Metal wiring in a given plane of the device reduces the amount of real estate available in that plane and can put severe constraints on device performance. These problems can undermine the overall objective to fabricate smaller, more densely packed devices having superior performance.

Prior publications which are exemplary of silicon on insulator process technology include Iwamatsu, U.S. Pat. No. 5,294,821. Iwamatsu discloses silicon-on-insulator technology which is intended to provide more uniform electrical characteristics including a reduction in breakdown voltage. Iwamatsu proposes a device having active layers diffused into the substrate to stabilize the electrical characteristics of the device.

Tyson et al., U.S. Pat. No. 5,145,802, discloses a silicon-on-insulator circuit which includes a set of buried body ties that provide a local ohmic contact to the transistor bodies disposed on an insulating layer. This is intended to provide a path for holes generated by impact ionization and also act as a potential shield between the substrate and the transistor sources.

Kang et al., U.S. Pat. No. 5,286,670, teaches a method of manufacturing a semiconductor device having buried elements with electrical characteristics. Kang uses a complex system buried electrical elements in the substrate bonding the substrate to the silicon that is to become the SOI region. One exemplary use for the buried elements is as capacitors in memory cells.

However, these publications do not address or resolve many of the problems which arise with increased device density. In fact, certain of these publications, such as Kang et al, add to the complexity of device fabrication without resolving concerns of wiring density.

As a result, there is a need for processes and devices which allow for the reduction of metal wiring in a given plane thereby allowing for greater device performance and greater design flexibility in high density applications.

SUMMARY OF THE INVENTION

In accordance with one aspect of the invention, there is provided a semiconductor device including a conductive substrate, an insulator layer, a silicon layer doped with impurities to form a transistor, and a conductive stud, the conductive stud electrically connecting portions of the silicon layer and the substrate.

In accordance with an additional aspect of the invention, there is provided a semiconductor device including a conductive substrate, an insulator layer, a silicon layer doped with impurities and forming a first transistor and a second transistor, an isolation volume between the first transistor and the second transistor, and a conductive stud extending from a doped silicon layer to the substrate.

One exemplary embodiment of the invention uses the bulk silicon substrate as a ground or power source for a semiconductor device such as a field effect transistor (FET). In a more preferred mode, the invention utilizes a highly doped substrate, fabricated from a bulk silicon wafer of typical thickness. The substrate may function as either a ground plane or a power source, (such as a Vdd plane). In this manner, the substrate eliminates a very large percentage of the metal wiring used for power distribution.

For example, with the invention, the majority of ground wires are eliminated by connecting all electrically grounded transistor devices to the bulk silicon substrate. This connection may be made with a buried conductive stud. The conductive stud generally extends from the active silicon layer through the insulator layer to electrically contact the thick, low resistivity bulk silicon substrate below.

With silicon on insulator (SOI) technology, traditional processing techniques may be used throughout fabrication of the device. The resulting device comprises electrical connections between the respective transistor regions and the highly conductive bulk silicon substrate. In turn, the substrate functions as a low resistance conductor between the devices. A single metal connection from an external ground or power source to the substrate may be used for multiple devices. The density of wiring across the surface of the device may also be reduced by a connection every several millimeters across the device surface which reduces the wires previously used for ground or power distribution.

Conventional SOI technology reduces a large portion of the drain capacitance and to a lesser extent the gate capacitance because the insulator layer does not have many available free carriers. However, in operation, carriers flow through the transistor and resistive heating may occur in the gate. Undesirable floating body effects including transistor or hysterisis and threshold shifts may occur if the transistor body is allowed to electrically float. The electrical bias placed on the device by the remaining carriers causes a narrowing in the depth of the transistor body channel which affects performance. An alternative embodiment of the invention provides a low-resistance path from the channel to either ground or Vdd plane and a thermal drain which reduces both the floating body and thermal effects.

DETAILED DESCRIPTION OF THE PREFERRED EMBODIMENT

Figure 1:
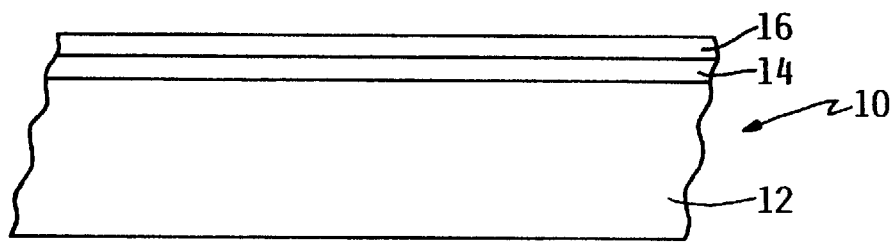
FIG. 1 is a cross-sectional view of the first stages of the formation of a silicon-on-insulator device in accordance with one embodiment of the invention.

The invention is a semiconductor device including a conductive substrate, an insulator layer, a silicon layer doped with impurities to form at least one semiconductor device, and a conductive stud. The conductive stud electrically connects the silicon layer and the substrate.

The invention is applicable to any number of device types known to those of skill in the art. Further, any number of materials may be used which are conductive to semiconductor processing. In accordance with one preferred aspect of the invention, the invention may be used with silicon-on-insulator (SOI) processing technology in the fabrication of field effect transistor devices. In accordance with this embodiment, the device of the invention may be fabricated through any number of processes known to those of skill in the art. The invention may be used for any number of devices, including those devices which have one or more transistors defined in the active silicon layer. As shown, in one exemplary embodiment, two transistors are formed on the silicon through FIGS. 1–9.

As a preliminary step, a silicon substrate 12 may be used. The silicon substrate 12 may take the form of a standard silicon wafer 10 which is treated to form the insulator layer 14, FIG. 1. While any number of insulator layers may be used, preferred compounds include silicon dioxide, $SiO_2$. The $SiO_2$ may be implanted into the wafer at an exemplary rate of about $1 \times 10^{18}$ atoms/cm$^2$ of oxygen. The wafer is heated at a temperature of about 900° C. to create an insulator layer having a thickness of about 0.2 to 0.7 $\mu$m and preferably about 0.5 $\mu$m. At the same time, the active silicon layer 16 is formed having a thickness of about 0.1 to 4 $\mu$m and preferably about 0.2 $\mu$m. The balance of substrate 12 has a thickness of about 625 $\mu$m. The active silicon layer results from the steps of implanting oxygen into the silicon wafer 10 and annealing the system to realign the crystal structure between the three layers. The insulator layer comprises a silicon oxide such as silicon dioxide. Silicon dioxide ($SiO_2$) is characterized by pronounced dielectric capabilities. The relative permittivity of $SiO_2$ is about 3.9.

The substrate 12 is generally conductive and may be used as a ground or a power source. In the context of the invention, use of the substrate 12 as a power source means that the substrate 12 is providing a constant voltage bias from an external source; i.e. something other than the substrate 12. Generally the substrate may be made conductive by using dopants. Generally, if the substrate is to be n-type, the dopant may comprise, for example, phosphorous, antimony, or arsenic. If the substrate is to be p-type, the dopant generally comprises boron or any other atomic species capable of creating this ionic character in the substrate 12.

Implantation of the ions generally occurs at a rate which provides about $1 \times 10^{16}$ to $3 \times 10^{21}$ and preferably about $5 \times 10^{19}$ to $1 \times 10^{21}$ atoms per cubic centimeter. Once doping is completed, the substrate 12 preferably has a resistance of less than about 10 ohms per square, preferably less than about 2 ohms/square, with a wafer resistivity of about 0.01 to 0.1 (ohm)-(cm).

Figure 2:
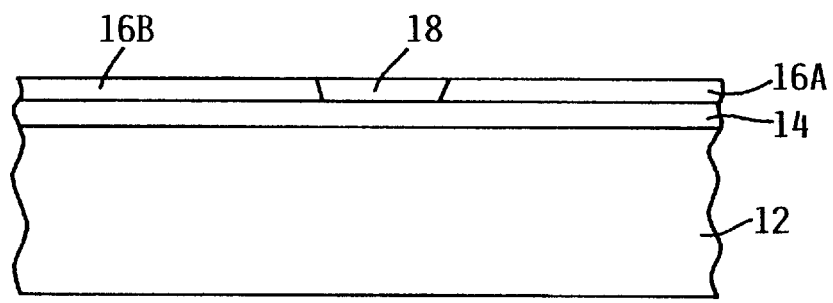
FIGS. 2 through 6 are additional cross-sectional views of subsequent stages of the formation of a depicted silicon-on-insulator device as depicted in FIG. 1.
Figure 3:
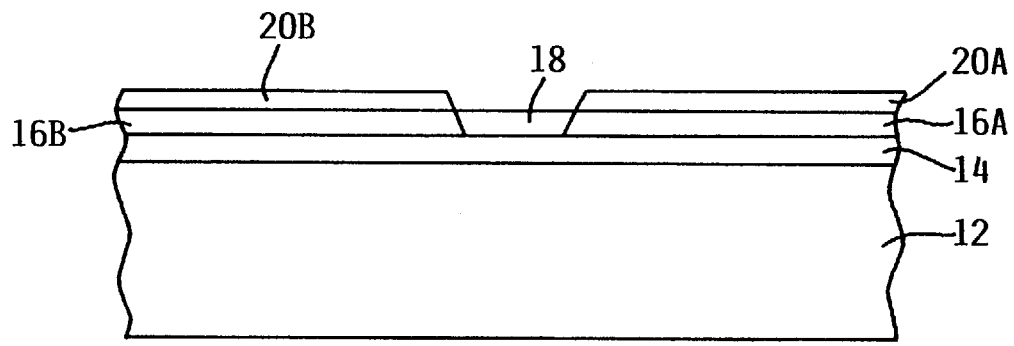
Figure 4:
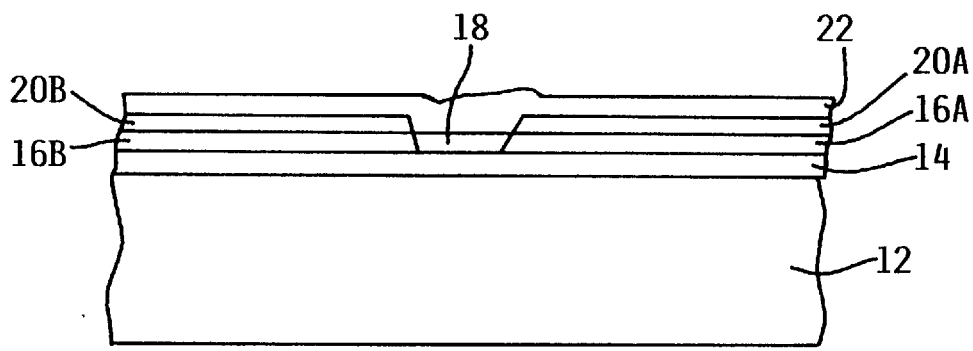
Figure 5:
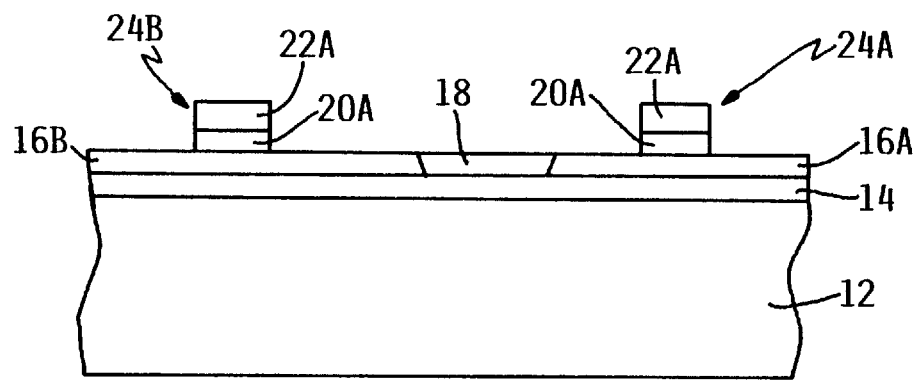
Figure 6:
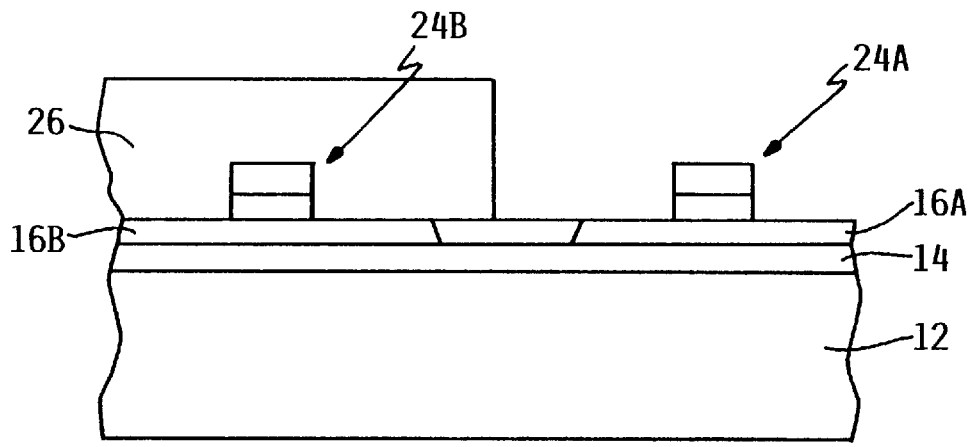
Figure 7A:
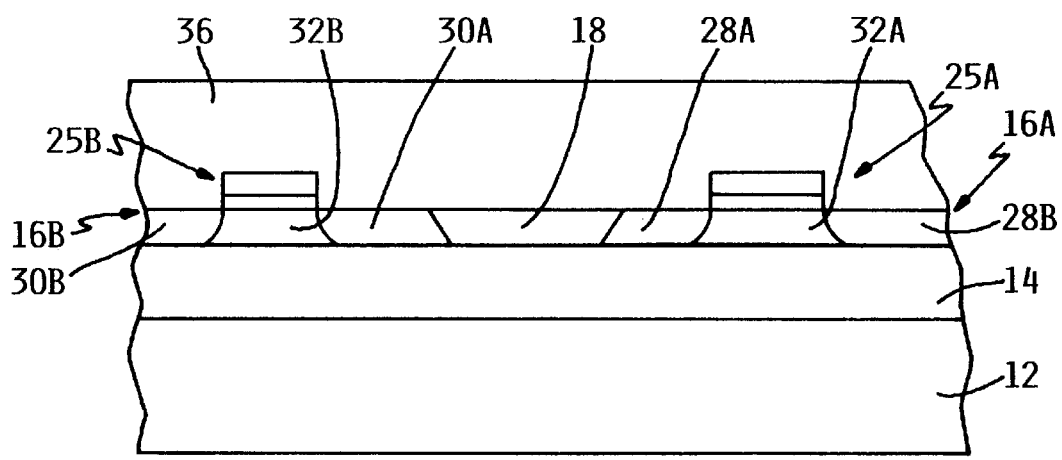
FIG. 7A is a cross-sectional view of one embodiment of a semiconductor device formed using silicon-on-insulator processing as depicted in FIGS. 1 through 6 in accordance with the invention.
Figure 7B:
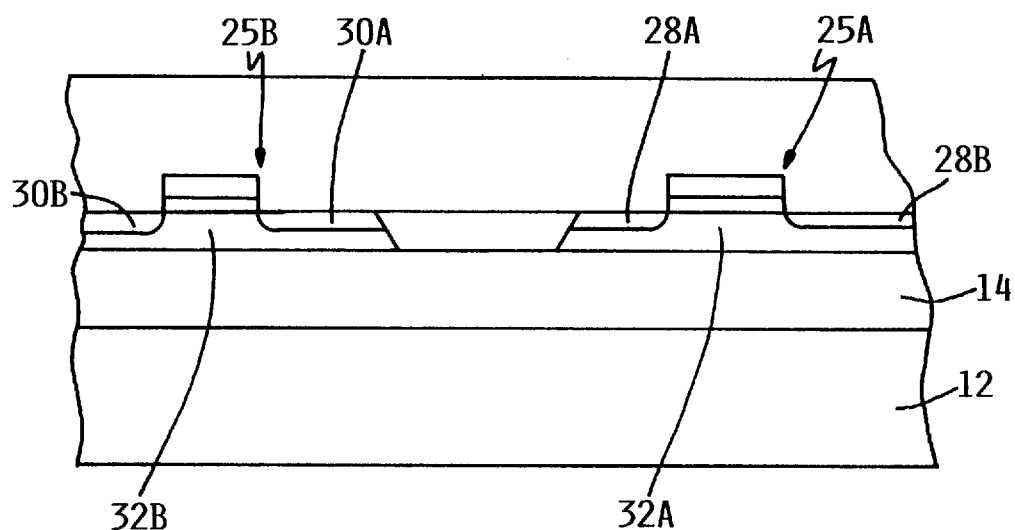
FIG. 7B is a cross-sectional view of an alternative embodiment of a semiconductor device formed using silicon-on-insulator processing as depicted in FIGS. 1 through 6 in accordance with the invention.

An isolation volume 18 is then formed between the two sites for the first and second transistors, FIG. 2, by traditional means. The photoresist is developed and removed over the volume which is to be the isolation volume 18. The exposed active silicon in the isolation volume is then removed by etching. Using standard device fabrication processes, the active silicon is etched down to the silicon dioxide insulator layer 14. An exemplary etchant may include carbon tetrachloride which provides high selectivity. The opening is then fabricated into the isolation volume 18 by refilling with an insulative material such as silicon dioxide using standard bulk processing methods such as chemical vapor deposition which provides conformal deposition of the material.

The gate for each transistor may then be formed. To do so, the photolithographic mask is removed and an oxide such as silicon dioxide 20A and 20B is formed on the active silicon by typical fabrication processes, FIG. 3. One method of forming the oxide 20A and 20B is by traditional steam processing under standard conditions, i.e., 900° C. to 1100° C. for about 20 minutes. Generally, the thickness of the silicon dioxide ranges from about 20 to 100 angstroms, with a typical thickness being about 50 Å.

To complete the transistor gates, a polysilicon layer 22 is then deposited over the silicon dioxide 20A and 20B to a thickness of about 2000 angstroms. Again this deposition may be completed by standard processing methods, e.g., chemical vapor deposition with a silane source gas at about 700° C.

A positive photoresist may then be deposited and patterned to form the gate conductors 24A and 24B from the polysilicon layer. At the same time, silicon dioxide layer 20A and 20B may also be removed. An implant mask 26 (FIG. 6) is then formed. The implant mask allows for the implanting of either n-type or p-type ions to form source and drain regions in the first transistor 25A, FIG. 7A. This process is then repeated to form the implant areas in the second transistor 25B, i.e. source and drain regions 30A and 30B.

In forming the source and drain for either the first or second transistor 25A and 25B, the ions may generally be diffused in the intended region to the interface between the active silicon 16A and 16B and the silicon dioxide insulator layer 14. Alternatively, the formed source and drain ion diffusion volumes may penetrate only partially into the active silicon layer, see FIG. 7B.

In operation this partial diffusion provides very definite characteristics in conjunction with the transistor bodies 32A and 32B. The diffusion of ions to a level which only partially penetrates the active silicon layer 16A and 16B, extends the transistor body into the area which will later be occupied by the conductive stud 34, FIGS. 8A and 8B. In this embodiment, the conductive stud provides a thermal drain for any resistive heating which may take place in the transistor body. The conductive stud also provides a drain for any free carriers, thereby reducing transistor floating body effects.

Once the transistor device is formed, a planarized dielectric 36 may be deposited over the surface of devices 25A and 25B. The dielectric 36 functions to stabilize the device, electrically isolating the device and stabilizing the device for further processing.

Figure 8A:
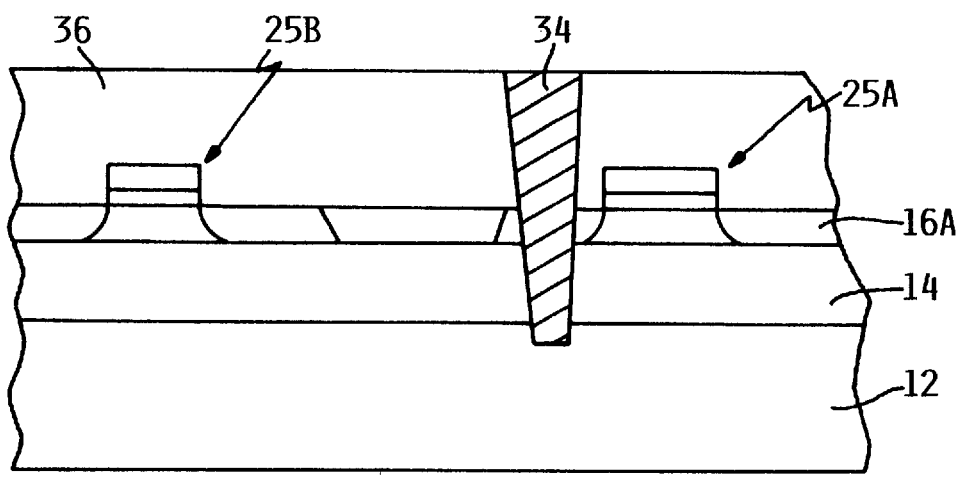
FIG. 8A is a cross-sectional view of a semiconductor device comprising a conductive stud in accordance with one embodiment of the invention.

The device is then masked to form the conductive stud 34, FIG. 8A. The stud 34 functions as a connection between the substrate 12 and the source of device 25A formed in the active silicon layer. Generally the stud 34 may comprise any number of conductive materials such as tungsten, aluminum, copper, or a conductive doped silicon. The opening for the stud may be formed through standard processing techniques such as a high pressure sputter etch in argon gas using a sequence of selective or non-selective etchants.

Preferably, the etchants used are non-selective and anisotropic. Anisotropic etchants cut directly downward towards the substrate and do not etch to any substantial degree in the horizontal plane. The opening for the conductive stud 34 extends into the substrate 12 to a level necessary to provide an electrical connection between the substrate 12 and device 25A, typically about 1 um. In addition to the connection to ground shown in FIG. 8A, the stud 34 may be used to connect one or more P+ regions 30A devices to a power source through substrate, FIG. 9. Added layers of dielectric 38 may then be deposited on the device.

Once the opening for the conductive stud 34 is formed, the opening is coated with a material which promotes adhesion to the surrounding oxide such as titanium or titanium nitride. This material adheres to the walls of the opening, A conductive material such as tungsten is then introduced into the opening and may be conformally placed in the opening by chemical vapor deposition or sputtering.

Figure 8B:
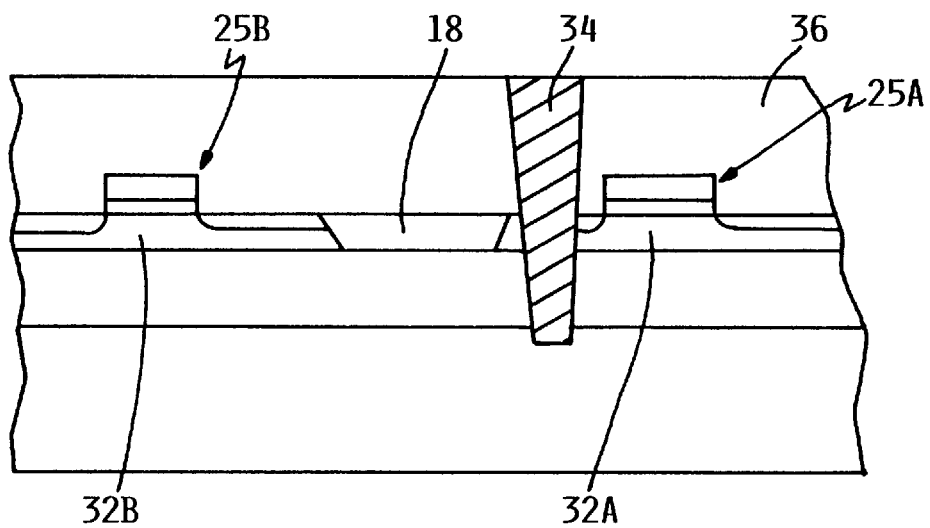
FIG. 8B is a cross-sectional view of a semiconductor device comprising a conductive stud in accordance with one alternative embodiment of the invention.
Figure 9:
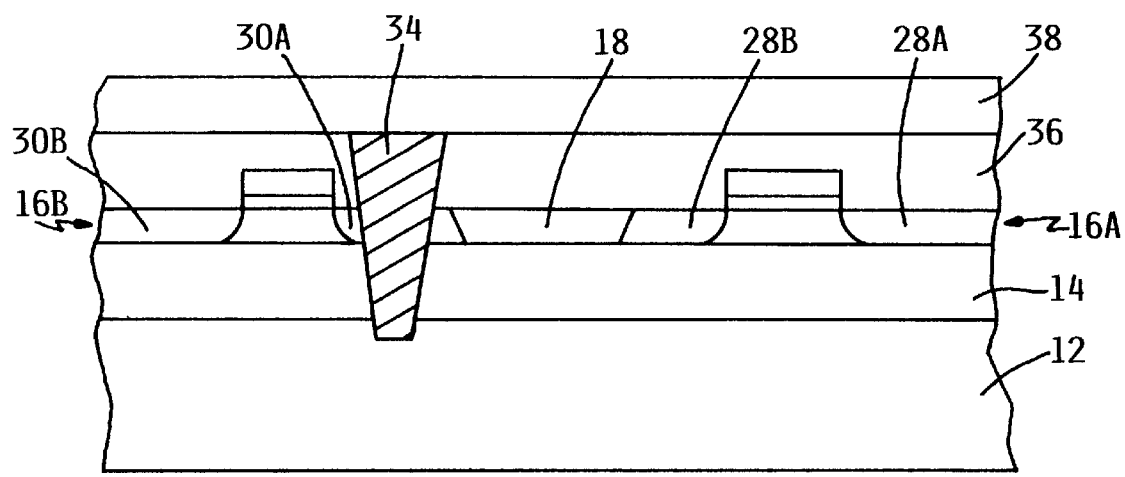
FIG. 9 is a cross-sectional view of a semiconductor device comprising a conductive stud in accordance with a further alternative embodiment of the invention.

In a further alternative embodiment of the invention, the conductive stud 34 may be formed in a manner which allows contact between the transistor body 32A and the stud 34, FIG. 8B. This embodiment of the invention provides many of the same advantages as the device shown in FIG. 7B by forming a drain for thermal energy and carriers.

The above specification, examples and data provide a complete description of the manufacture and use of the composition of the invention. Since many embodiments of the invention can be made without departing from the spirit and scope of the invention, the invention resides in the claims hereinafter appended.

The claimed invention is:

1. A semiconductor device comprising:
   (a) a conductive substrate;
   (b) an insulator layer on said conductive substrate;
   (c) a silicon layer on said insulator layer doped with impurities to form a transistor;
   (d) a conductive stud, said conductive stud electrically connecting said silicon layer and said substrate; and
   (e) an insulating layer formed over said silicon layer and said conductive stud.

2. The device of claim 1, wherein said substrate comprises doped silicon.

3. The device of claim 1, wherein said insulator layer comprises an oxide of silicon.

4. The device of claim 1, wherein said transistor comprises a transistor body and said stud is positioned adjacent said transistor body.

5. The device of claim 1, wherein said transistor comprises a transistor body and said stud and said transistor body are in electrical contact.

6. The device of claims 4 or 5, wherein said stud comprises tungsten.

7. The device of claim 1, wherein said substrate comprises a ground.

8. The device of claim 1, wherein said substrate comprises a power source.

9. The device of claim 1 or 5, wherein said impurities in said silicon layer do not contact said insulator layer.

10. The device of claim 2, wherein said substrate is doped with an n-type dopant selected from the group consisting of phosphorous, antimony, arsenic and mixtures thereof, and wherein said transistor comprises a p-channel, and said conductive stud electrically connecting said substrate and said transistor.

11. The device of claim 2, wherein said substrate is doped with a p-type dopant, said dopant comprising boron, and wherein said transistor comprises a n-channel, and said conductive stud electrically connecting said substrate and said transistor.

12. The device of claim 2, wherein said substrate is doped with a p-type dopant, said dopant comprising boron, and wherein said transistor comprises a p-channel, and said conductive stud electrically connects said substrate and said transistor.

13. The device of claim 2, wherein said substrate is doped with an n-type dopant selected from the group consisting of antiprouy, arsenic, phosphorous and mixtures thereof, and wherein said transistor comprises an n-channel, and said conductive stud electrically connects said substrate and said transistor.

14. A semiconductor device comprising:
   (a) a conductive substrate;
   (b) an insulator layer on said conductive substrate;
   (c) a silicon layer on said insulator layer, said silicon layer doped with impurities and forming a first transistor and a second transistor;
   (d) an isolation volume between said first transistor and said second transistor;
   (e) a conductive stud extending from said doped silicon layer to said substrate; and
   an insulating layer formed over said silicon layer and said conductive stud.

15. The device of claim 14, wherein said substrate comprises doped silicon.

16. The device of claim 14, wherein said insulator layer comprises silicon dioxide.

17. The device of claim 14, wherein said first transistor comprises a transistor body and said conductive stud is positioned adjacent said transistor body.

18. The device of claim 14, wherein said first transistor comprises a transistor body and said stud and said transistor body are in electrical contact.

19. The device of claims 17 or 18, wherein said stud comprises tungsten.

20. The device of claim 14 or 18, wherein said impurities in said silicon layer forming said first transistor do not contact said insulator layer.

21. The device of claim 14, wherein said conductive substrate comprises a ground, said first transistor comprises a p-FET and said second transistor comprises an n-FET, wherein said p-FET and said n-FET are separated by a silicon oxide isolation volume and said conductive stud electrically connects said n-FET source to said ground.

22. The device of claim 14, wherein said conductive substrate comprises a power source, said first transistor comprises a p-FET and said second transistor comprises an n-FET, wherein said p-FET and said n-FET are separated by a silicon oxide isolation volume and said conductive stud electrically connects said p-FET source to said power source.

23. The device of claim 14, comprising a first conductive stud and a second conductive stud, wherein said first transistor is electrically connected to said substrate by said first conductive stud and said second transistor is electrically connected to said substrate by said first conductive stud and said second transistor is electrically connected to said substrate by said second conductive stud.

* * * * *

UNITED STATES PATENT AND TRADEMARK OFFICE
CERTIFICATE OF CORRECTION

PATENT NO.    : 5,889,306
DATED         : Mar. 30, 1999
INVENTOR(S)   : Todd Alan Christensen and John Sheets It is certified that error appears in the above-identified patent and that said Letters Patent is hereby corrected as shown below:

Claim 13, Col. 6, Line 13, "antiprouy" should be --antimony--.

Signed and Sealed this

Third Day of August, 1999

Attest:

Q. TODD DICKINSON

Attesting Officer

Acting Commissioner of Patents and Trademarks